United States Patent
Mowat

(10) Patent No.: US 6,290,758 B1
(45) Date of Patent: Sep. 18, 2001

(54) EQUIPMENT HOUSING WITH HUMIDITY PUMP

(75) Inventor: Scott Mowat, New South Wales (AU)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/375,564

(22) Filed: Aug. 17, 1999

(30) Foreign Application Priority Data

Sep. 17, 1998 (AU) .................................. PP6015

(51) Int. Cl.[7] .......................... B01D 53/04; B01D 53/26
(52) U.S. Cl. ........................ 96/126; 96/130; 96/146; 96/147
(58) Field of Search ................ 96/121, 122, 126–128, 96/130, 134, 142, 143, 146, 147

(56) References Cited

U.S. PATENT DOCUMENTS

| | | | |
|---|---|---|---|
| 3,626,671 | * 12/1971 | Ebeling, Jr. ................ | 96/126 |
| 3,734,293 | * 5/1973 | Biskis ......................... | 96/126 X |
| 3,844,737 | * 10/1974 | Macriss et al. ............. | 96/126 X |
| 3,925,021 | * 12/1975 | Yoshino et al. ............. | 96/121 X |
| 4,374,655 | * 2/1983 | Grodzka et al. ............ | 96/126 X |
| 4,377,398 | * 3/1983 | Bennett ....................... | 96/146 |
| 4,402,717 | * 9/1983 | Izumo et al. ................ | 96/144 X |
| 4,614,528 | * 9/1986 | Lennen ....................... | 96/147 |
| 4,661,128 | * 4/1987 | Bachhofer et al. .......... | 96/127 |
| 4,726,817 | * 2/1988 | Roger .......................... | 96/143 X |
| 5,997,616 | * 12/1999 | Ledru et al. ................. | 96/134 X |
| 6,110,261 | * 8/2000 | Guiragossian .............. | 96/147 X |

FOREIGN PATENT DOCUMENTS

| | | | |
|---|---|---|---|
| 2177016A | * 1/1987 | (GB) .................................. | 96/147 |
| 58-153029(A) | * 9/1983 | (JP) .................................... | 96/126 |
| 01-030624A | * 2/1989 | (JP) .................................... | 96/146 |
| 02-187123A | * 7/1990 | (JP) .................................... | 96/134 |
| 03-260532(A) | * 11/1991 | (JP) .................................... | 96/143 |
| 04-063843(A) | * 2/1992 | (JP) .................................... | 96/143 |
| 04-064841(A) | * 2/1992 | (JP) .................................... | 96/143 |
| 04-064842(A) | * 2/1992 | (JP) .................................... | 96/143 |
| 04-278136(A) | * 10/1992 | (JP) .................................... | 96/134 |
| 04-278137(A) | * 10/1992 | (JP) .................................... | 96/134 |
| 04-281132(A) | * 10/1992 | (JP) .................................... | 96/143 |
| 04-281133(A) | * 10/1992 | (JP) .................................... | 96/143 |
| 04-283332(A) | * 10/1992 | (JP) .................................... | 96/143 |
| 05-000222(A) | * 1/1993 | (JP) .................................... | 96/126 |
| 05-007721(A) | * 1/1993 | (JP) .................................... | 96/127 |
| 06-091131(A) | * 4/1994 | (JP) .................................... | 96/143 |

* cited by examiner

Primary Examiner—Robert H. Spitzer
(74) Attorney, Agent, or Firm—Sughrue, Mion, Zinn, Macpeak & Seas, PLLC

(57) ABSTRACT

The humidity in an equipment housing, 1, is reduced by providing a humidity pump which extracts humidity from the closed housing and vents it to the outside atmosphere. A tube 2 passes through a wall 11 of the housing and is open to the internal and external atmospheres. The tube 2 contains a first portion of hygroscopic regenerative desiccant 4 to absorb moisture in the housing. Wicking material 10 transfers the moisture to a second portion of regenerative desiccant 7. A heater 8 drives off the moisture from portion 7 creating a "moisture gradient" whereby moisture is continuously drawn off from the inside of the housing.

3 Claims, 2 Drawing Sheets

EQUIPMENT HOUSING WITH HUMIDITY PUMP

BACKGROUND OF THE INVENTION

Sealed environment housings provide higher short term reliability for the electronics than vented enclosures, particularly for equipment located underground in cable pits.

However, the sealed housings suffer from a build-up of humidity and the resulting condensation can affect the reliability of the components. Previous attempts to overcome this problem have included an "Umbrella" over the components to divert condensation on the inside of the lid away from the components. This arrangement does not lower the overall humidity and condensation can still occur directly on the components, particularly those which operate intermittently or at low temperatures.

SUMMARY OF THE INVENTION

This invention proposes the provision of a sealed enclosure with a humidity pump to reduce the humidity within the enclosure.

In a first embodiment, the humidity pump includes a receptacle passing through a wall of the enclosure, the receptacle having access to the internal atmosphere within the enclosure and to the external atmosphere, there being a regenerative desiccant within the receptacle, and heater means to heat at least a first part of the regenerative desiccant to drive off moisture to the external atmosphere.

Preferably, a membrane which is permeable to water vapour but substantially impermeable to water, separates at least the first part of the desiccant from the outer atmosphere to prevent external water from contacting the desiccant.

In one embodiment, the desiccant is divided into first and second parts and separated by a wicking material.

In a further embodiment, a cooling mechanism, such as a Peltier device is provided to cool a part of the receptacle exposed to the inner atmosphere to facilitate condensation on the cooled part.

In a modification of this embodiment, wicking material is used to draw condensate from the cooled part to the desiccant.

In a still further embodiment, the humidity pump includes condensing means within the enclosure, wicking means to draw off the condensate to the outside of enclosure, and heating means to heat at least a first part of the wicking means to drive off moisture to the outer atmosphere. Preferably a vapour permeable membrane isolates the wicking material from the external atmosphere.

DETAILED DESCRIPTION OF THE EMBODIMENTS

Figure 1:
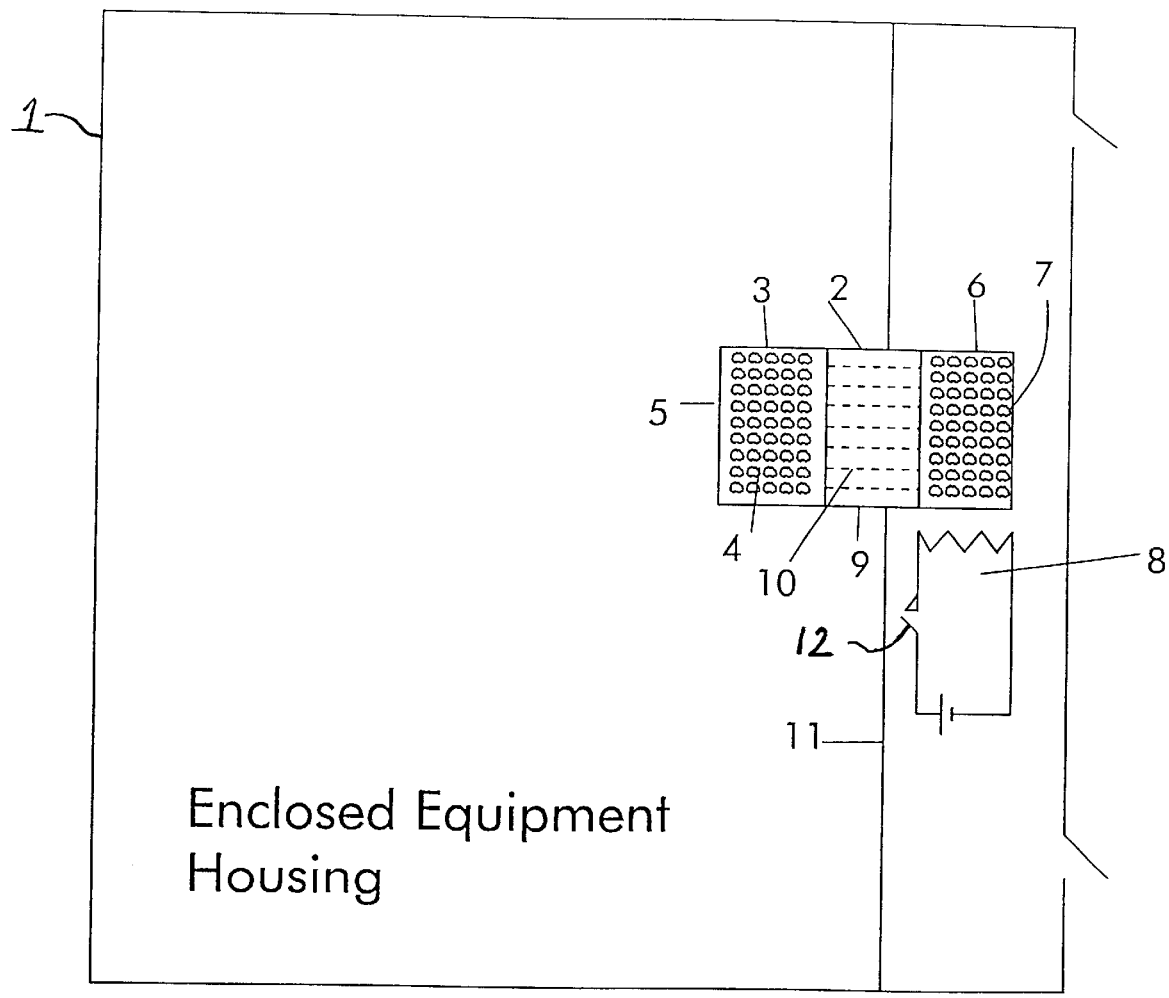
FIG. 1 is a schematic representation of an equipment housing fitted with a humidity pump embodying the invention.

The invention will be described with reference to the embodiments shown in the drawings.

In FIG. 1, an enclosed equipment housing 1 is fitted with a breather or humidity pump 9 in the form of a tube 2 passing through wall 11. The ends 5 and 7 of the tube permit access to the internal and external atmosphere respectively. Ends 3 and 6 of the tube are filled with a regenerative desiccant, e.g., granules 4, a first section of the desiccant being exposed to the internal atmosphere and a second section being exposed to the external atmosphere. A heater 8 is arranged to heat at least part of the desiccant to dry it out and drive at least a portion of the moisture off into the external atmosphere.

In one embodiment, the tube is filled with desiccant. In the embodiment illustrated in FIG. 1, first and second sections of desiccant at ends 3 and 6 are linked by wicking material 10.

In operation, the inner atmosphere temperature and hence, pressure, fluctuates as the heat generated by the equipment varies or as the external temperature varies. Thus, air is passing in or out of the housing via the breather with these pressure fluctuations in relation to the external pressure.

As air is drawn in, the desiccants in the tube draw off some of the moisture and subsequently, the desiccant at end 3 absorbs moisture from the inner atmosphere, and, when the desiccant at end 3 contains more moisture than the desiccant at end 6 some of the moisture will be drawn from end 3 to the desiccant at end 6 by the wicking material 10 (or via the intermediate desiccant in the case where the tube is full of desiccant).

The heater at end 6 may be turned on intermittently or periodically via switch 12 to drive off moisture at end 6 to maintain a "moisture differential" between the inner and outer desiccant. To this end, the ends 3 and 6 of the tube 2 may be perforated to enable moisture to be absorbed at end 3 and driven off at end 6.

In one refinement of the invention, the heater 8 may be controlled by a device measuring the moisture content of the desiccant. The moisture content may be measured, e.g., resistively or capacitively.

Figure 2:
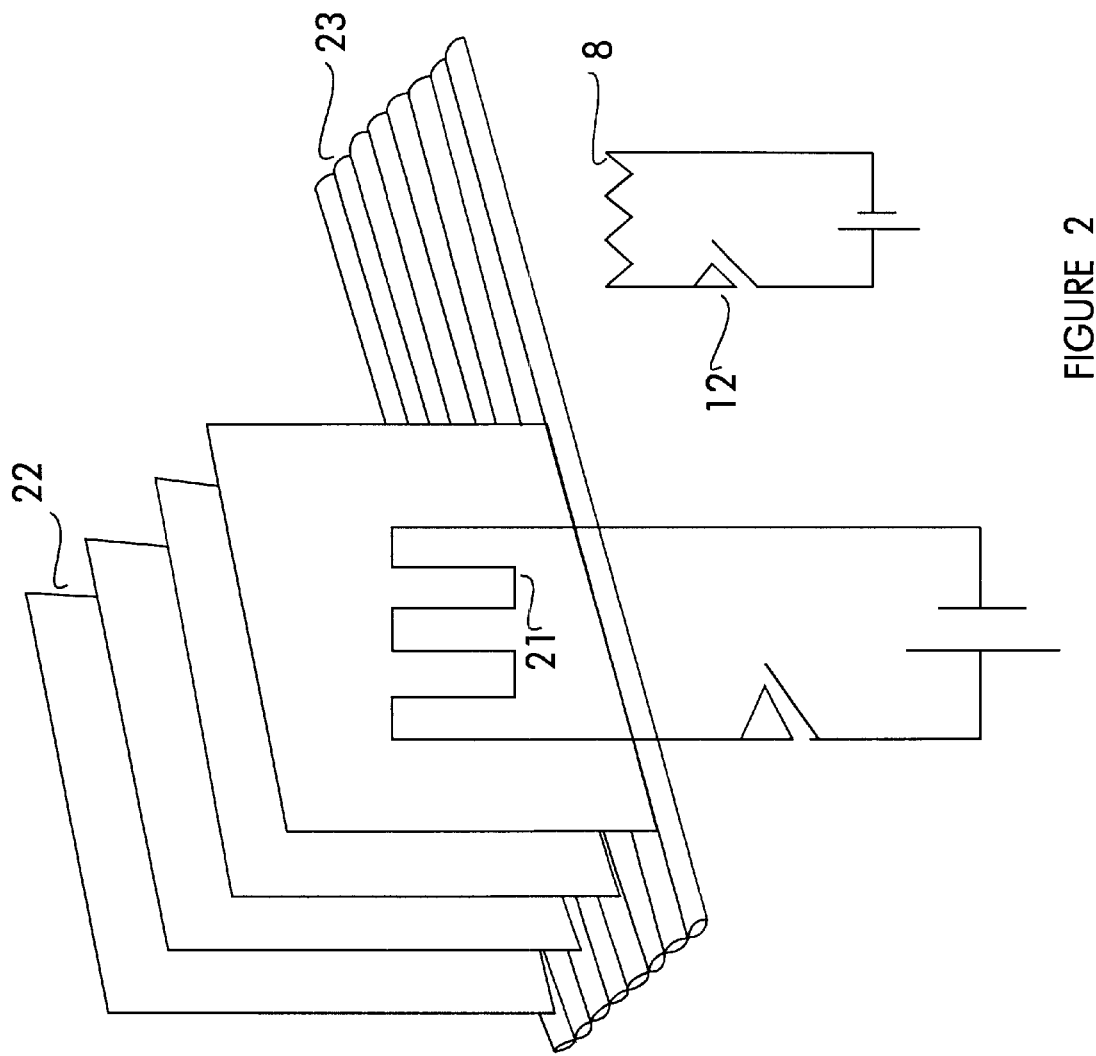
FIG. 2 shows an alternative embodiment of a humidity pump.

In an alternative embodiment shown in FIG. 2, cooling mechanism 21 such as a Peltier device may be used to cool condensation elements 22 connected to end 3 of the tube to improve the efficiency of the moisture scavenging operation. In this case, the tube (not shown) may be filled with desiccant (or in an alternative, it may contain only wicking material 23) to absorb the condensation and convey it to the end of the tube where the desiccant (or wicking material) is heated to drive off some of the moisture by heater 9.

The perforated end 6 of tube 2 may be covered by a vapour permeable, water resistant material (e.g., Goretex™) to enable the moisture to be driven off from end 6 and to prevent ingress of water.

However, in the embodiment shown, the end 6 of the breather is contained in a vented enclosure. In this case, the vapour permeable cover need not be used.

What is claimed is:

1. A humidity pump comprising:
   means to draw moisture from an inner atmosphere of an enclosed housing,
   means to drive off moisture drawn from the inner atmosphere to an exterior atmosphere,
   a breather element formed of a receptacle having access to the inner atmosphere and the outer atmosphere through a wall of the housing, and
   heater means to drive off some of the moisture to the outer atmosphere,
   wherein the means to draw moisture includes a regenerative desiccant, and the heater means is arranged to heat at least part of the desiccant to cause moisture to be driven off to the outer atmosphere, and wherein the desiccant is divided into a first part to absorb moisture form the inner atmosphere and a second part heated by the heater, the first and second parts being linked by a wicking material.

2. A humidity pump comprising:

means to draw moisture from an inner atmosphere of an enclosed housing;

means to drive off moisture drawn from the inner atmosphere to an exterior atmosphere, wherein the means to draw moisture includes condensation means cooled by cooling means; and wicking means for drawing moisture from the condensation means to the means to drive off moisture.

3. A humidity pump to draw moisture from an inner atmosphere of an enclosed housing to an outer atmosphere, comprising:

a tube with a first end which accesses the inner atmosphere of the enclosed housing and a second end which accesses the outer atmosphere, wherein said first end of said tube is filled with a regenerative desiccant and said second end of said tube is filled with said desiccant;

a wicking material which links said first end of said tube and said second end of said tube and which is interposed between said desiccant at said first end and at said second end; and a heater, disposed adjacent said second end of said tube to heat said desiccant at said second end of said tube and to drive off moisture into the outer atmosphere.

* * * * *